United States Patent [19]

Bergmann et al.

[11] Patent Number: 5,196,062
[45] Date of Patent: Mar. 23, 1993

[54] ARRANGEMENT FOR HOLDING AND COOLING WORK PIECES POSITIONED NEXT TO ONE ANOTHER

[75] Inventors: Erich Bergmann, Mels; Martin Zäch, Balzers, both of Switzerland; Anton Kunz, Triesenberg, Liechtenstein

[73] Assignee: Balzers Aktiengesellschaft, Furstentum, Liechtenstein

[21] Appl. No.: 688,093

[22] Filed: Apr. 19, 1991

[30] Foreign Application Priority Data

Apr. 20, 1990 [CH] Switzerland .............. 1351/90-8

[51] Int. Cl.⁵ .............................................. B65G 29/00
[52] U.S. Cl. ...................................... 118/69; 118/500; 432/223; 198/803.01
[58] Field of Search .................. 427/295; 118/69, 500, 118/50, 59, 230, 503; 432/223, 225; 156/498, 567; 198/803.01

[56] References Cited

U.S. PATENT DOCUMENTS

| | | |
|---|---|---|
| 4,891,009 | 1/1990 | Pivit et al. ............................ 432/225 |
| 5,058,731 | 10/1991 | Corniani et al. ................ 198/803.01 |

*Primary Examiner*—W. Gary Jones
*Assistant Examiner*—Charles K. Friedman
*Attorney, Agent, or Firm*—Notaro & Michalos

[57] ABSTRACT

An arrangement for holding and cooling bearing shell blanks (2) positioned one next to the other during a coating process in a vacuum chamber, has cooling body and work piece holding pairs (3) which are detachable from each other and which are connected to one another via a cooling surface (9) and a heat transmission surface (7). A work piece holding part (5) of the cooling body and the work piece holding pair (3) is implemented so that the bearing shell blanks (2) are placed in a concave bearing surface (32) of the holding part during the coating process and are kept, over their entire surface, at a temperature determined by the cooling surface temperature. A temperature gradient can be formed if teflon foil strips are placed on the bearing surface. These allow only a direct heat contact of the apex of the bearing shell blanks (2) with the bearing surface. At the apex then, a deposition of fine particles with a high surface hardness, and at the margins a deposition of coarse particles with a correspondingly lesser surface hardness, take place. During the coating, the work piece holding parts (5) can already be loaded whereby the pass in the production of bearing shells (2) can be considerably shortened.

11 Claims, 3 Drawing Sheets

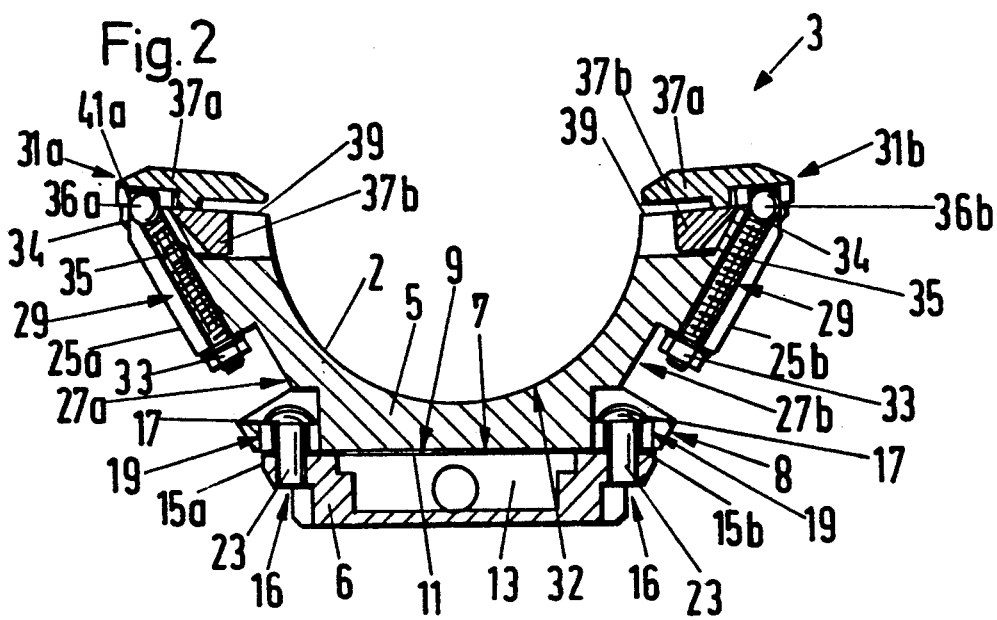
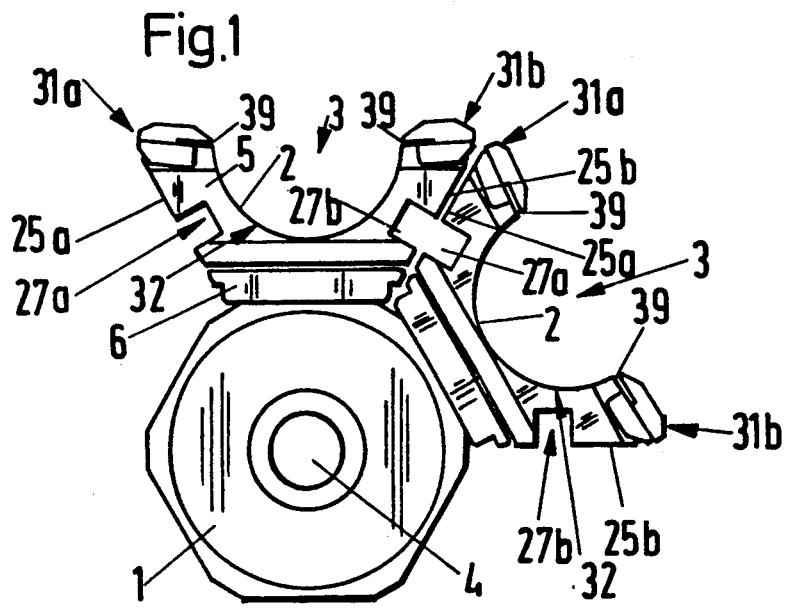
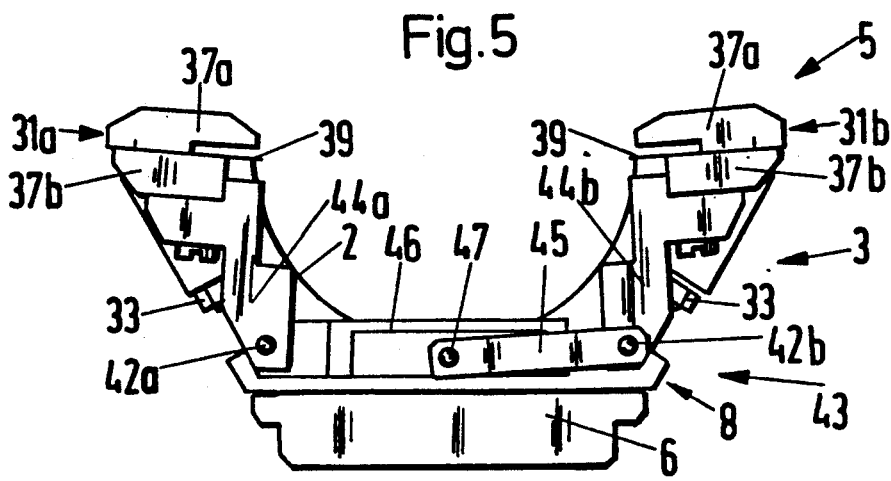

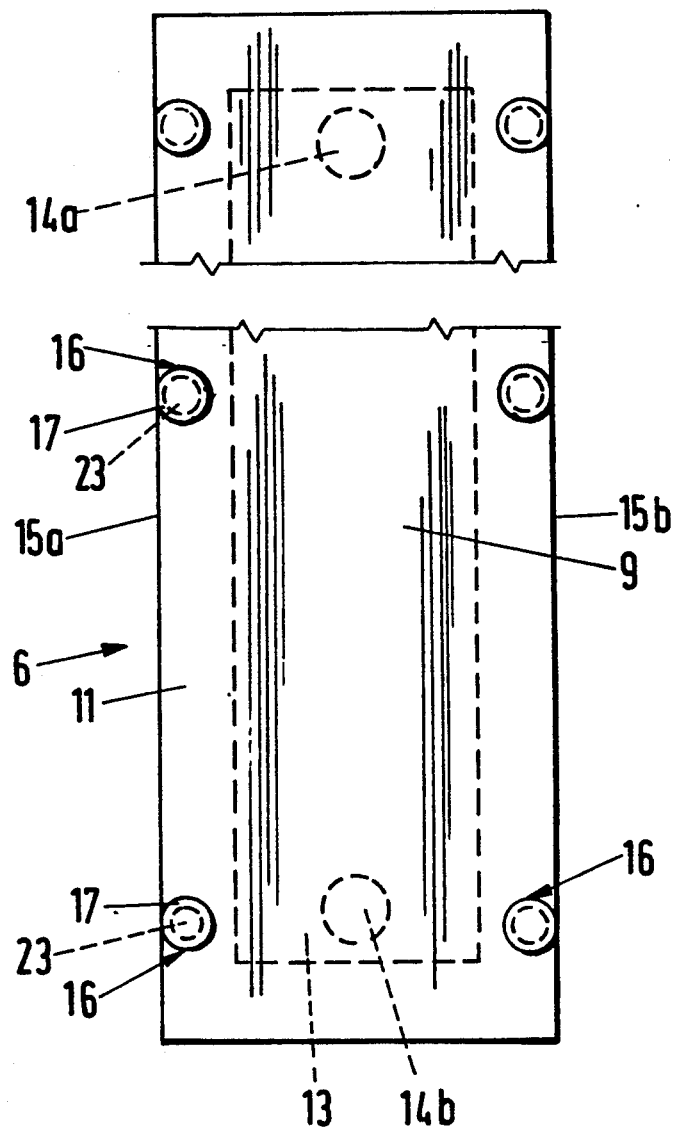
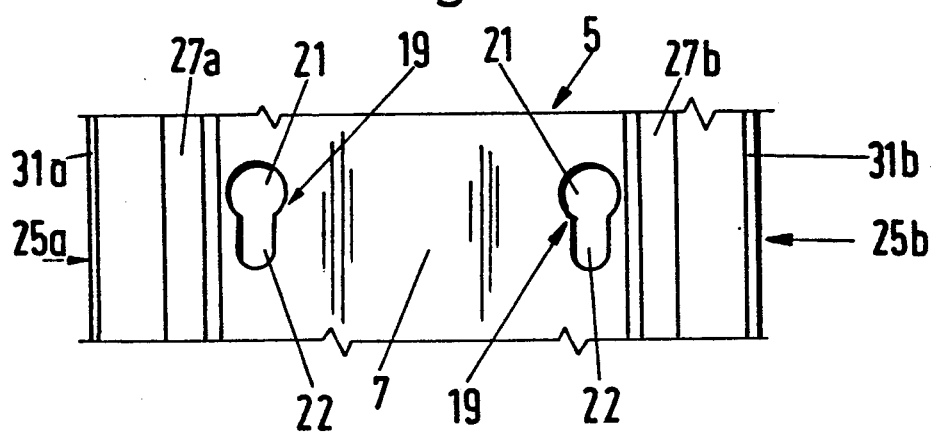

ARRANGEMENT FOR HOLDING AND COOLING WORK PIECES POSITIONED NEXT TO ONE ANOTHER

FIELD AND BACKGROUND OF THE INVENTION

The present invention relates to an arrangement for holding and cooling work pieces that are placed next to one another, and to a method for coating the work pieces placed in the arrangement, with a slide coating of a selected hardness.

European patent document EP-PA 0 272 447, which is equivalent to U.S. Pat. No. 4,889,772, discloses a method for the production of a composite material such as a slide coating on bearing shells. An apparatus which can be used to practice this method, but which is not part of the prior art, has a groove-shaped surface into which the bearing shell blanks to be coated are placed and pressed using one margin shoulder. Each margin shoulder is screwed tight to a longitudinal side of the groove-shaped surface. The base of the groove-shaped surface is cooled through a longitudinal bore at the bottom of the wall of the arrangement, if possible along a line. Hereby on the apex of the bearing shells adjacent the base, fine particles with a high surface hardness are deposited and toward the margin, coarse particles with a correspondingly lesser surface hardness are deposited. Bearing shells with such a hardness distribution have an especially high serviceable life.

Placement of the work pieces could take place either inside the vacuum chamber or outside in the case of arrangements which are screwed out of the vacuum chamber. If the arrangement was screwed out of the vacuum chamber this was, on the one hand, time-consuming and cumbersome. In addition, care had to be taken that no cooling fluid ran into the vacuum chamber. Placing the work pieces in the vacuum chamber in order to avoid having the cooling fluid run out was possible, however, hereby the processing time for each coated work piece was increased due to the idle time of the vacuum coating chamber.

Another arrangement described in German patent document DE-OS 37 17 712, which is equivalent to U.S. Pat. No. 4,891,009, allows the work pieces to be placed into a work piece holder outside of the vacuum coating chamber. In the work piece holder a hollow space filled with cooling means and extending approximately over the entire bearing surface of the bearing shells is available for heat storage. Special measures are taken in order to carry off the heat absorbed by the heat storage during the coating process on a head part of the work piece holding means. To improve the temperature constancy during the coating process a metal shell with good heat transmission is used as the bearing surface for the bearing shell blanks. Good heat transmission is achieved through fins, wires or strips.

The arrangement described in DE-OS 37 17 712 does indeed allow placement of the work pieces outside of the vacuum chamber, however, the apparatus is heavy and consequently cumbersome.

SUMMARY OF THE INVENTION

The present invention is based on the task of creating an arrangement for receiving work pieces, in particular bearing shell blanks, which reduces the idle time of the vacuum chamber while at the same time ensuring a good coating quality.

Accordingly, an object of the present invention is to provide an arrangement for holding and cooling work pieces which are disposed one next to the other, during a coating operation in a vacuum coating chamber, which comprises at least one longitudinal cooling body and a work piece holding pair which is detachable from one another and whose longitudinal work piece holding part has, on one side thereof, a bearing surface for the work piece. The opposite side of the work piece holding pair carries a heat transfer surface which extends over the entire length of the bearing surface and whose cooling body part has a cooling surface adapted for heat transfer from the heat transfer surface.

A further object of the present invention is to provide a method of coating a work piece, in particular, a shell blank, which utilizes the arrangement of the invention and wherein the temperature of the cooling surface is regulated during the coating process in order to achieve a selected hardness for the coating.

A still further object of the present invention is to provide an arrangement for holding and cooling work pieces which is simple in design, rugged in construction and economical to manufacture.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which a preferred embodiment of the invention are illustrated.

BRIEF DESCRIPTION OF THE DRAWINGS

In the following, an example of the arrangement according to the invention and of the method according to the invention will be explained in further detail with reference to the drawings, wherein:

FIG. 1 is a top plan view of an arrangement with six cooling body and work piece holding pairs fastened on a rotatable carrier, wherein, in order to avoid overloading the representation, only two pairs are shown;

FIG. 2 is a cross sectional view through a cooling body and work piece holding pair of the arrangement;

FIG. 3 is a side view of the cooling body part of the cooling body and work piece holding pair represented in FIG. 1 and 2;

FIG. 4 is a partial side view of the heat transmission surface of the work piece holding part of the cooling body and work piece holding pair represented in FIG. 1 and 2;

FIG. 5 is a top plan view of the cooling body and work piece holding pair with a lever device for pressing the work pieces onto a bearing surface of the work piece holding part.

DESCRIPTION OF THE PREFERRED EMBODIMENTS

Figure 6:
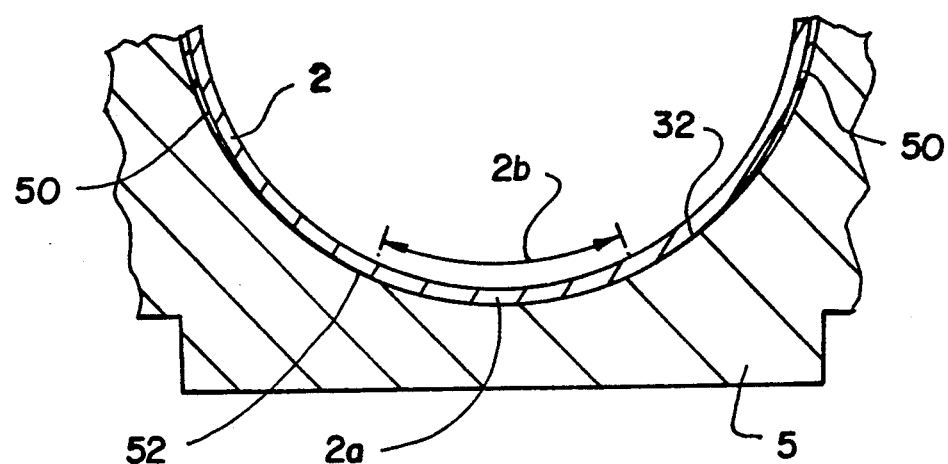
FIG. 6 is a schematic sectional view showing a polytetrafluoroethylene foil for use with the present invention.

The arrangement shown in a top view in FIG. 1 for holding and cooling bearing shell blanks 2 placed one next to the another for coating in a vacuum chamber (not shown), has a longitudinal hexagonal carrier 1 which is supported rotatably about an axis of rotation 4 in the vacuum chamber and on which six cooling body and work piece holding pairs 3 are fastened of which only two are shown in order to avoid overloading the representation. Nine carriers 1 are disposed in the vacuum chamber. Each cooling body and work piece holding pair 3 comprises a longitudinal work piece holding part 5 and cooling body part 6. Work piece holding part 5 and cooling body part 6 are attached one on the other without tools and can also be detached from each other without tools wherein the cooling body part 6 always remains firmly connected to the carrier 1. In the joined state the work piece holding part 5 lies with its heat transmission surface 7 disposed in a plate-like floor region 8 on a cooling surface 9 of the cooling body part 6 adapted to the heat transmission surface 7.

The cooling surface 9 is an approximately 0.3 mm thick steel foil 11 covering a hollow space 13 through which water flows as the cooling fluid. Stainless steel was selected as the material for the cooling surface 9 since it has good corrosion resistance. Surprisingly, the rigid steel foil 11 moulds itself well to the heat transmission surface 7 in particular if the hollow space 13 is maintained at a slight excess pressure relative to the surroundings. In this way, the cooling surface 9, to a small extent, is convexly deformed. The hollow space 13 is connected to a cooling means inlet 14a and outlet 14b, which are connected to cooling lines (not shown) in the carrier 1.

Fittings 16 are provided along the longitudinal margin 15a and 15b of the cooling surface 9, at approximately equal distances as can be seen in the cross section through the cooling body and work piece holding pair 3 in FIG. 2 and in the side view onto the cooling surface 9 in FIG. 3.

Heads 17 of the fittings 16 as shown in FIG. 2, reach through keyhole-like openings 19 shown in FIG. 4, into the heat transmission surface 7 of the work piece holding part 5. The positions of the openings 19 are selected so as to fit the positions of the fittings 16 on the cooling surface 9. The openings 19 are implemented so that the fitting heads 17 of all fittings 16 can be moved through the particular large opening part 21 of the opening 19. The large opening part 21 is adjoined by a slot 22 whose width is greater, by a small tolerance, than the width of the fitting neck 23. The slot depth is greater by a small tolerance than the length of the fitting neck 23. To connect the work piece holding part 5 to the cooling body part 6, the fitting heads 17 are moved through the opening parts 21 and the work piece holding part 5 is pulled in the direction of the slots 22 whereupon the fitting necks 23 slide in the slots 22 up to the slot end. Since the slot 22 is narrower than the fitting head 17, the work piece holding part 5 is held securely on the cooling body part 6. The margin surface of the openings 19 facing away from the heat transmission surface 7 extend parallel to the heat transmission surface, but the invention can also be implemented so that the margin surface of the openings 19 are slightly inclined toward the slot end in order to achieve a jamming of the fitting head 17 against the slot end. This incline, however, can be omitted since the cooling surface 9 through the pressure obtaining in the hollow space 13 is, to a slight extent, elastically arched toward the outside.

The heat transmission surface 7 is as large as the cooling surface 9 and the width of both surfaces 7 and 9 is approximately as wide as the margin distance of the bearing shell blanks 2 to be coated. Above the heat transmission surface 7 a longitudinal groove 27a and 27b extends on each lateral limitation 25a and 25b of the work piece holding part 5. The limitations or sides 25a and 25b are disposed at an angle of approximately 120° degrees with respect to the heat transmission surface 7 so that six work piece holding parts 5 can be fastened on the carrier 1. In the longitudinal grooves 27a and 27b are located the bearing surfaces for the fitting heads 17 and an axle mounting 29 described below for open- and close-latchable shoulders 31a and 31b along the margins of the lateral limitations 25a and 25b in order to be able to press closely the bearing shell blanks 2 into a concave semicylindrical bearing surface 32 in the work piece holding part 5. The dimension of the longitudinal grooves 27a and 27b is selected so that nuts 33, described below, can be set in readily. The longitudinal grooves 27a and 27b also represent a savings of material and, consequently, of weight which, as described below, allows easy handling of the work piece holding part 5. The basic body of the work piece holding part 5 is produced of aluminum in order to advantageously utilize its good heat transmission capability, good workability, and low weight.

The axle mounting 29 fastened by several nuts 33 in the longitudinal groove 27a and 27b, respectively comprise, in each instance, a threaded rod 35 which is welded tightly to an axle 36a or 36b, respectively. The axle 36a or 36b, respectively, is disposed in each instance in an axle recess 34 on the limitation or side 25a or 25b, respectively, of the work piece holding part 5. The shoulder 31a or 31b, respectively, has a upper shoulder part 37a and a lower shoulder part 37b as well as a metal strip 39 of spring steel which acts as a spring element. The metal strip 39 is clamped between the upper shoulder and lower shoulder parts 37a and 37b. The upper and lower parts 37a and 37b have, on the axle 36a or 36b, respectively, a relief 41a (only one being labeled) each for their support which encompass the axle 36a or 36b, respectively, with a clearance fit. The shoulders 31a and 31b are simultaneously open- and close-latchable by means of a lever device 43 wherein the lever device 43 is implemented so that the shoulders are self-locking in the close-latched state.

The lever device 43 which in FIG. 5 is represented in the locked, close-latched state, comprises a left and right shoulder arm 44a and 44b, screwed to the respective lower shoulder parts 37b. At the end of the shoulder arms 44b and 44a facing away from the lower shoulder part 37b, a bar-shaped lever 45 or a U-shaped lever 46 is pivoted with its one end in a joint 42b or 42a, respectively. The shank distance of the U-shaped lever 46 is dimensioned so that the two shanks reach over the side faces of the bar-shaped lever 45. With respect to its length also the lever 46 reaches beyond lever 45. A swivel axis 47 extends through the shanks of the lever 46 and through the end of the lever 45 not supported on the shoulder arm 44b. In the locked state of the lever device 43, swivel axis 47 is located approximately in the base of the floor region 8.

For open-latching the shoulders, the lever 46 is pulled at the location of the swivel axis 47, away from the floor region 8.

If bearing shell blanks 2, as stated above, are to be coated, they are placed one next to the other onto the bearing surface 32 of the work piece holding part 5 outside of the vacuum chamber with the shoulders 31a and 31b latched open. Depending on the width of the bearing shell blanks 2 and the length of the work piece holding part 5 typically twenty bearing shell blanks 2 can be placed in each holding part 5, each made of non-alloyed tool steel with a 200 μm thick carrier layer of high-lead bronze (CuPb 23Su4) applied in the sintering process.

During the simultaneous close-latching of the shoulders 31a and 31b the metal strips 39 exert pressure on the margins of the bearing shell blanks 2 whereby these are pressed into the bearing surface 32 so that they are in close contact with a good heat contact. Due to the spring effect of the metal strips 39 slight differences of dimensions of the bearing shell blanks 2 are equalized. As explained above, 54 work piece holding parts 5 can be coated on nine carriers 1, during one coating process in the vacuum chamber.

Work piece holding parts 5 already placed on the carrier 1 from a previous coating process are removed and replaced by ones loaded with uncoated bearing shell blanks 2. After attaching the work piece holding parts 5, the vacuum chamber is closed and the coating process started with a cathode sputtering installation which is known per se.

In the case of nine carriers 1 with six work piece holding parts 5 each which are loaded with twenty bearing shell blanks 2 each, coating takes place for eight hours with a total power of 120 kW at a pressure of 1.2 Pa in argon, in the complete absence of oxygen. As the target, an aluminum tin alloy AlSn20Cu1 is used. Herein the cooling water outlet temperature becomes 25° C. greater than the cooling water inlet temperature. Depending on the desired hardness in a heat exchanger (not shown), the cooling water inlet temperature is set as shown in the following:

| Cooling water inlet temperature | Coat hardness in the apex |
|---|---|
| 10° C. | 150-170 HV |
| 30° C. | 130-140 HV |
| 60° C. | 100-120 HV |
| 80° C. | 70-90 HV | where HV indicates Vickers hardness. At the end of the coating process a layer thickness of 150 μm has been achieved.

Instead of placing the bearing shell blanks 2 directly into the bearing surface 32 it is possible to insert between bearing shell blanks 2 and bearing surface 32 two approximately 1 mm thick polytetrafluoroethylene foil strips (FIG. 6). One longitudinal side of each foil strip 50 tapers to a cutting edge 52. Both foil strips are placed onto the bearing surface 32 of the work piece holding part 5, which during the loading is approximately horizontal, so that a slot along the deepest portion of the bearing surface 32 results. The foil strips due to their adhesion adhere on the bearing surface 32. The bearing shell blanks 2 are placed onto the foil strips and, as already described above, are clamped using the shoulders 31a and 31b.

The polytetrafluoroethylene foil is a good heat insulator. The bearing shell blanks 2 have only at their apex 2a a good heat contact 2b with the bearing surface 32; all other parts are heat-insulated through the polytetrafluoroethylene foil. Due to the heat being carried off only at the apex of the bearing shell blanks 2 the temperature decreases in the direction toward the margins of the blanks 2. After the coating process, fine particles with a high surface hardness have been deposited at the apex of the bearing shells 2, and in the direction toward the margins, coarse particles with correspondingly lesser surface hardness have been deposited.

Instead of setting the cooling surface temperature by means of water flowing through the hollow space 13, it can also be regulated through a Peltier element (not shown) below the cooling surface 9.

Since bearing shells 2 already coated are removed from the work piece holding parts 5 outside of the vacuum chamber and subsequently uncoated bearing shell blanks 2 are newly set in, coating of the bearing shell blanks 2 in the vacuum chamber can take place during the loading of the work piece holding parts 5. Hereby coating can take place continuously in the vacuum chamber whereby the pass in the production of bearing shells 2 is considerably shortened.

Since the cooling body part 6 of the cooling body and work piece holding pair 3 is fixedly connected to the carrier 1, it can, given optimum layout of the cooling circulation, be connected to the carrier 1. Further through decoupling of the cooling body part 6 from the work piece holding part 5 the weight of the movable and transportable part of the cooling body and work piece holding pair 3 can be considerably reduced. A reduction of weight allows simpler and easier handling and consequently also faster loading times. As a further advantage a greater degree of cleanness in the coating results since, on the one hand, no cooling fluid can run into the vacuum chamber, such as, for example, in the case of the arrangement used in the method described in EP-PA 0 272 447, and, further, the time is markedly shortened during which the vacuum chamber is open.

Opposite the longitudinal bore in the arrangement relating to EP-PA 0 272 447 a hollow space 13 through which flows a cooling means is used which, as described above, is covered over with a thin steel foil 11 as cooling surface 6 which is a good heat conductor. The cooling surface 6 is in good heat contact via the large heat transmission surface 7 of the floor region 8 of the work piece holding part 5. Hereby the through-flow of cooling means can be reduced.

As best shown in FIGS. 1 and 3, the longitudinal bearing surface 32 has a longitudinal surface projection that extends down onto the heat transfer surface 7, the heat transfer surface 7 being parallel to and extending over the entire length of the longitudinal surface projection of the bearing surface 32, and being separated from the bearing surface 32 only by a solid metallic material-thickness of the workpiece holding part 5. To maximize heat transfer from the bearing surface 32 to the heat transfer surface 7. The solid metallic material-thickness of the workpiece holder 5, which separates the heat transfer surface 7 from the bearing surface 32, is also relatively thin compared to the extend of the heat transfer surface.

While a specific embodiment of the invention has been shown and described in detail to illustrate the application of the principles of the invention, it will be understood that the invention may be embodied otherwise without departing from such principles.

What is claimed is:
1. An arrangement for holding and cooling work pieces (2) placed next to one another during a coating process in a vacuum coating chamber, comprising:
at least one longitudinal cooling body part (6);
at least one longitudinal work piece holding part (5);
coupling means for detachably connecting said longitudinal cooling body part (6) to said longitudinal work piece holding part (5);
said longitudinal work piece holding part (5) having, on one side thereof, a longitudinal bearing surface

(32) for work pieces (2), and, on an opposite side thereof, a first heat transfer surface (7), said longitudinal bearing surface (32) having a longitudinal surface projection and said first heat transfer surface (7) extending parallel to and over the entire length of the longitudinal surface projection of said bearing surface (32), said first heat transfer surface (7) and said longitudinal bearing surface (32) being separated only by a solid metallic material-thickness of said work piece holding part (5) which is thin compared to the extent of said first heat transfer surface (7); and said cooling body part (6) having a second longitudinal heat transfer surface (9) with a surface area of at least the same dimensions as a surface area of said first heat transfer surface (7), when said work piece holding part (5) is connected to said cooling body part (6), so that said first heat transfer surface (7) is totally covered by said second heat transfer surface (9).

2. An arrangement as stated in claim 1, wherein the cooling body part (6) has a hollow space (13) bordering approximately the entire cooling surface (9) through which a cooling liquid can flow.

3. An arrangement according to claim 2, wherein said second heat transfer surface (9) is formed of a deformable foil which closes said hollow space (13) so that when said work piece holding part (5) is connected to said cooling body part (6), said second heat transfer surface (9) is pressable areal against said first heat transfer surface (7) over the surface thereof, by pressure of a cooling liquid in said hollow space (13).

4. An arrangement according to claim 1, wherein said longitudinal work piece holding part (5) has pressing means (31a, 31b, 43) for pressing work pieces (2) onto said bearing surface (32), said bearing surface (32) being solid and massive and not elastically or plastically adaptable to the shape of the work pieces (2) when the work pieces (2) are pressed by said pressing means (31a, 31b, 43) against said bearing surface (32) with the shape of the work pieces adapting to the contour of said bearing surface (32).

5. An arrangement as stated in claim 1, wherein the bearing surface (32) is groove-shaped and the work piece holding part (5) has a plate-like floor region (8) carrying the heat transfer surface (7), a width and length of the floor region corresponding approximately and at least to a respective width and length of the groove-shaped bearing surface (32).

6. An arrangement as stated in claim 1, wherein the bearing surface (32) has opposite longitudinal margins, the arrangement including one open- and close-latchable shoulder (31a, 31b) connected to each margin for holding and pressing work pieces (2) onto the bearing surface (32).

7. An arrangement as stated in claim 6, wherein each shoulder (31a, 31b) includes a spring element (39) which, in a close-latched position of the shoulder presses work pieces (2) placed into the work piece holding part (5) closely against the bearing surface (32) of the work piece holding part (5).

8. An arrangement as stated in claim 1, including a longitudinal carrier (1) rotatably supported in a vacuum chamber for rotation around an axis of rotation (4), and a plurality of said cooling body parts (6) extending parallel to the axis of rotation (4) and connected to and around the carrier (1), a work piece holding part (5) detachably connected to each cooling body part (6), each holding part (5) having a pair of opposite lateral limitations (25a, 25b) which extend approximately radially to the axis of rotation (4).

9. An arrangement as stated in claim 1, including heat-insulating margins of the work pieces from the bearing surface (32) by placing an insulating foil between the work piece and the bearing surface so that essentially only an apex part of the work piece (2) are in direct heat contact with the bearing surface (32) so that during the coating process a temperature gradient forms on the work piece surfaces to be coated transversely to the longitudinal extent of the work piece holding part.

10. An arrangement according to claim 1, wherein said coupling means have a first and a second coupling part, said first coupling part being insertable into said second coupling part, said first and said second coupling parts after insertion being movable in opposition parallel to the plane of said second heat transfer surface (9) for pressing said first heat transfer surface (7) against said second heat transfer surface (9) and detachably connecting said work piece holding part (5) to said cooling part (6) without using any tools.

11. An arrangement for holding and cooling work pieces (2) placed next to one another during a coating process in a vacuum coating chamber, comprising:

at least one longitudinal cooling body part (6);

a longitudinal work piece holding part (5) detachably connected to the cooling body part, the longitudinal work piece holding part (5) having a bearing surface (32) for work pieces (2) on one side and a heat transfer surface (7) extending over the entire length of the bearing surface (32) on an opposite side;

the cooling body part (6) having a cooling surface (9) for heat transfer contact with the heat transfer surface (7), for carrying off heat from the heat transfer surface (7); and a longitudinal carrier (1) rotatably supported in a vacuum chamber for rotation around an axis of rotation (4), and a plurality of said cooling body parts (6) extending parallel to the axis of rotation (4) and connected to and around the carrier (1), a work piece holding part (5) detachably connected to each cooling body part (6), each holding part (5) having a pair of opposite lateral limitations (25a, 25b) which extend approximately radially to the axis of rotation (4).

* * * * *